United States Patent
Reznicek

(10) Patent No.: US 11,069,688 B2
(45) Date of Patent: *Jul. 20, 2021

(54) VERTICAL TRANSISTOR WITH EDRAM

(71) Applicant: INTERNATIONAL BUSINESS MACHINES CORPORATION, Armonk, NY (US)

(72) Inventor: Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

This patent is subject to a terminal disclaimer.

(21) Appl. No.: 15/986,154

(22) Filed: May 22, 2018

(65) Prior Publication Data
US 2019/0363092 A1 Nov. 28, 2019

(51) Int. Cl.
*H01L 27/108* (2006.01)
*H01L 29/94* (2006.01)

(52) U.S. Cl.
CPC .... *H01L 27/10864* (2013.01); *H01L 27/1087* (2013.01); *H01L 27/10832* (2013.01); *H01L 27/10861* (2013.01); *H01L 29/945* (2013.01)

(58) Field of Classification Search
CPC ........... H01L 27/1087; H01L 27/10867; H01L 29/945; H01L 27/10829; H01L 29/66181; H01L 27/10832; H01L 27/10861; H01L 27/1082; H01L 27/10841; H01L 27/10876; H01L 27/10864; H01L 29/78642
USPC ........ 438/243, 244, 256, 386, 388; 257/296, 257/301, E21.646, E21.653, E27.084, 257/E29.346
See application file for complete search history.

(56) References Cited

U.S. PATENT DOCUMENTS

| | | |
|---|---|---|
| 6,355,520 B1 | 3/2002 | Park et al. |
| 6,391,703 B1 | 5/2002 | Rovedo et al. |
| 6,727,539 B2 | 4/2004 | Divakaruni et al. |
| 6,858,891 B2 | 2/2005 | Farnworth et al. |

(Continued)

OTHER PUBLICATIONS

Technologies for scaling vertical transistor DRAM cells to 70 nm R. Divakaruni; C. Radens; M. Belyansky; M. Chudzik; D. -G. Park; S. Saroop; D. Chidambarrao; M. Weybright; H. Akatsu; L. Economikos; K. Settlemyer; J. Strane; D. Dobuzinsky; N. Edleman; G. Feng; Y. Li; R. Jammy; E. Crabbe; G. Bronner 2003 Symposium on VLSI Technology. Digest of Technical Papers (IEEE Cat. No. 03CH37407) Year: 2003, pp. 59-60.

(Continued)

*Primary Examiner* — David Chen
(74) *Attorney, Agent, or Firm* — Patterson + Sheridan, LLP

(57) ABSTRACT

Structures and methods for making vertical transistors in the Embedded Dynamic Random Access Memory (eDRAM) scheme are provided. A method includes: providing a bulk substrate with a first doped layer thereon, depositing a first hard mask over the substrate, forming a trench through the substrate, filling the trench with a first polysilicon material, and after filling the trench with the first polysilicon material, i) growing a second polysilicon material over the first polysilicon material and ii) epitaxially growing a second doped layer over the first doped layer, where the grown second polysilicon material and epitaxially grown second doped layer form a basis for a strap merging the second doped layer and the second polysilicon material.

11 Claims, 6 Drawing Sheets

(56) References Cited

U.S. PATENT DOCUMENTS

| | | | |
|---|---|---|---|
| 7,129,130 B2 | 10/2006 | Adkisson et al. | |
| 8,120,094 B2 | 2/2012 | Liaw et al. | |
| 8,492,819 B2 | 7/2013 | Anderson et al. | |
| 8,557,670 B1 | 10/2013 | Cai et al. | |
| 8,673,729 B1 | 3/2014 | Basker et al. | |
| 9,059,213 B2 | 6/2015 | Booth, Jr. et al. | |
| 2002/0076880 A1 | 6/2002 | Yamada et al. | |
| 2005/0285175 A1 | 12/2005 | Cheng et al. | |
| 2009/0256185 A1* | 10/2009 | Cheng | H01L 27/1203 257/301 |
| 2010/0283093 A1 | 11/2010 | Pei et al. | |
| 2011/0272762 A1* | 11/2011 | Booth, Jr. | H01L 21/84 257/347 |
| 2013/0328161 A1 | 12/2013 | Cheng et al. | |
| 2014/0299882 A1* | 10/2014 | Chan | H01L 27/1211 257/66 |
| 2015/0221726 A1* | 8/2015 | Wong | H01L 29/1083 257/288 |
| 2016/0284709 A1* | 9/2016 | Basker | H01L 29/7856 |
| 2017/0062436 A1* | 3/2017 | Guillorn | H01L 21/30604 |

OTHER PUBLICATIONS

"Vertical DRAM Cell Structure Using Vertical Transistor in The Trench Capacitor" IBM TDB n3a 08-90 p. 72-75 IPCOM000101351D Mar. 16, 2005.

IBM, List of IBM Patents or Patent Applications Treated as Related for U.S. Appl. No. 15/986,154, filed May 22, 2018.

U.S. Appl. No. 15/986,203, entitled "Vertical Transistor With eDRAM," filed May 22, 2018.

\* cited by examiner

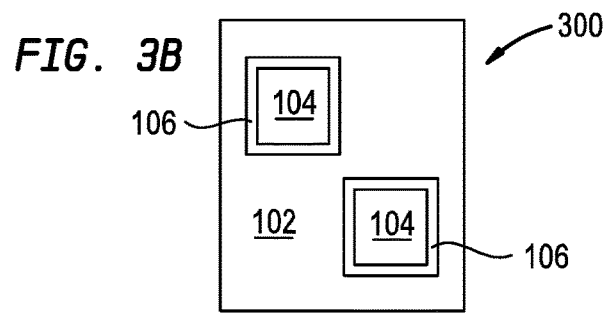
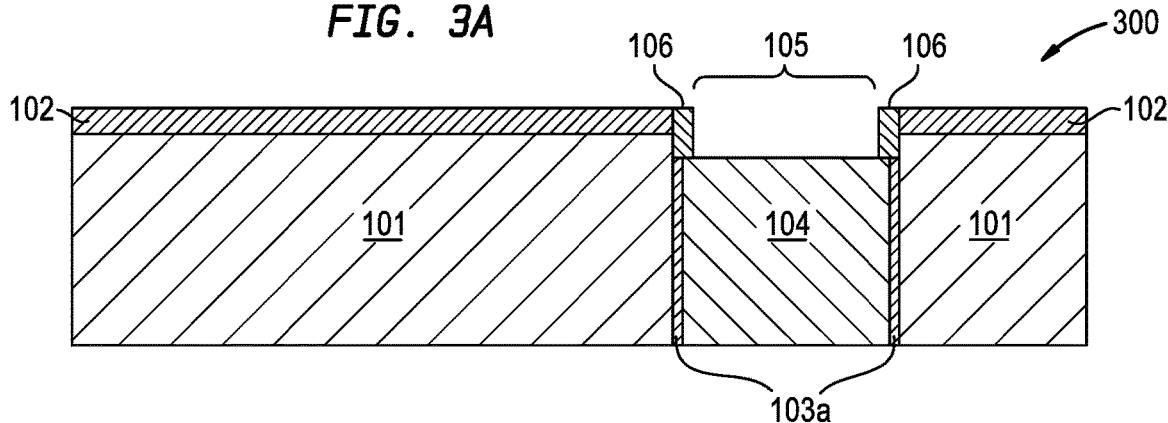
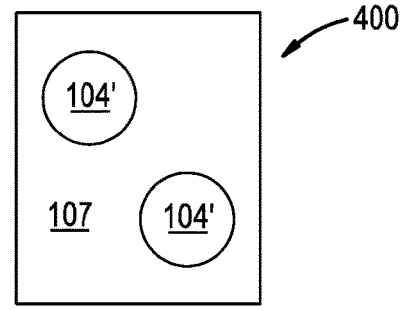
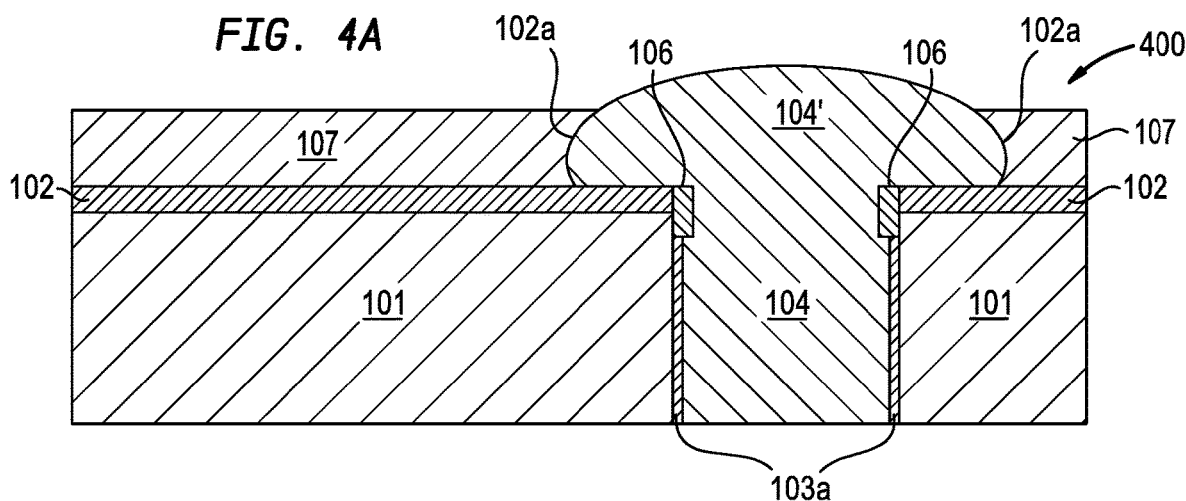

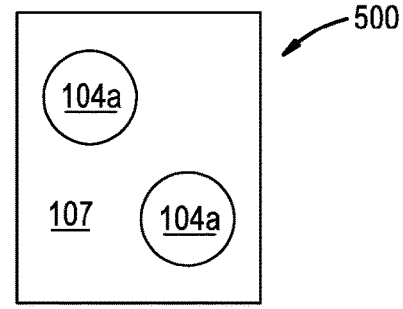
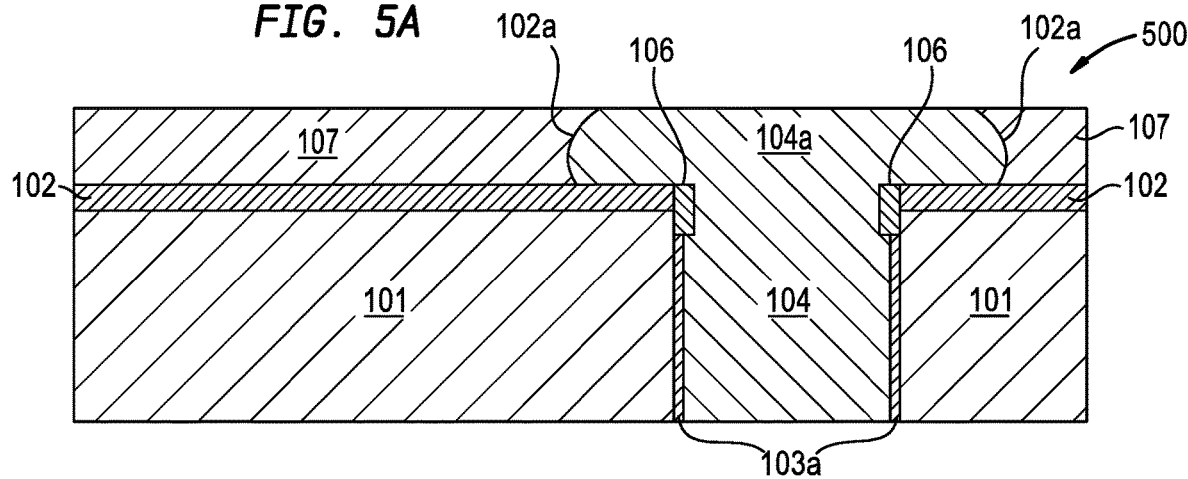
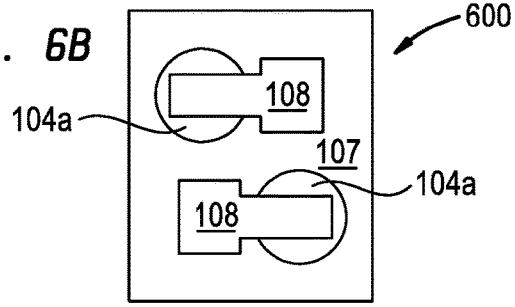
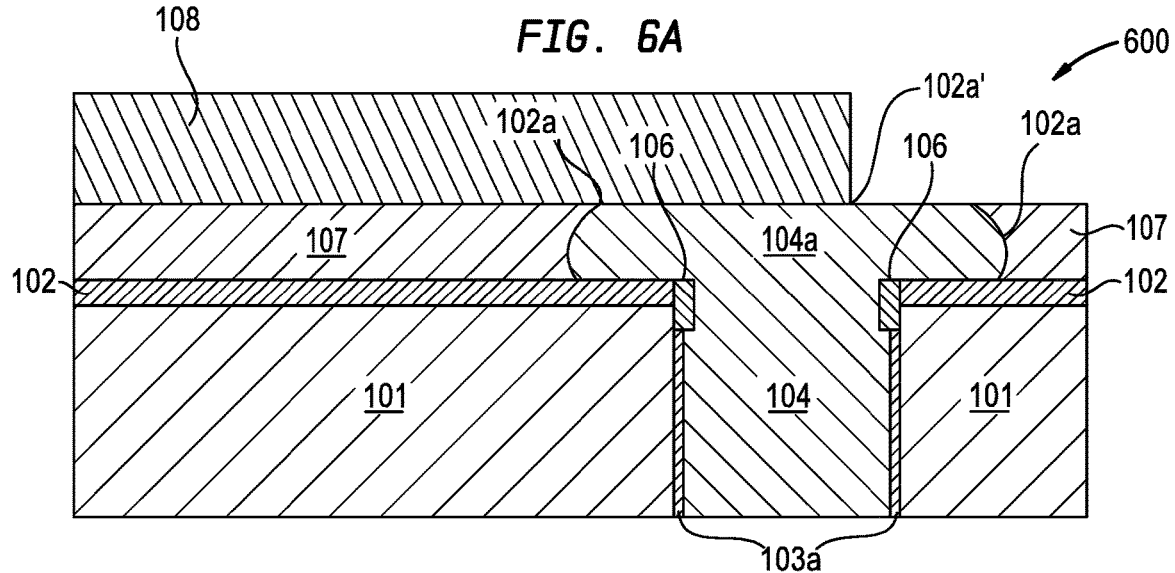

VERTICAL TRANSISTOR WITH EDRAM

BACKGROUND

The present disclosure relates to a semiconductor structure and a method of forming the same. More particularly, the present disclosure relates to semiconductor structures including vertical transistor structures employing deep trenches which may be used in memory devices such as, e.g., embedded dynamic random access memory (eDRAM) in order to enhance device density and mitigate deficiencies associated with shorting and lateral overgrowth issues, including lateral eDRAM to eDRAM shorts.

DRAM employs memory cells usually having a transistor and a storage capacitor embedded in a deep trench and arranged in series. eDRAM embeds these memory cells into the same semiconducting material that contains a microprocessor, which allows for wider buses and faster operating speeds (as compared to DRAM) in an integrated circuit (IC) chip. Many of these embedded memory cells, including transistors and storage capacitors, can be arranged on a single chip or within a single package to define an array. Operation of the memory cells is controlled by various circuits, many of which are structurally different from each other and warrant different manufacturing techniques.

Conventional vertical transistors are devices where the source-drain current flows in a direction normal to the substrate surface. In such devices, a vertical semiconductor pillar defines the channel with the source and drain located at opposing ends of the semiconductor pillar. One advantage of a vertical transistor is that the channel length is not defined by lithography, but by methods such as epitaxy or layer deposition, which enable precise dimensional control.

As such, vertical transistors are an attractive option for technology scaling to smaller nodes, but the increasing density in those technology nodes introduces various adverse effects that require attention to improve device performance.

SUMMARY

One aspect of the present disclosure includes a method for making a semiconductor structure. The method includes: providing a bulk substrate with a first doped layer thereon, depositing a first hard mask over the substrate, forming a trench through the substrate, filling the trench with a first polysilicon material, and after filling the trench with the first polysilicon material, i) growing a second polysilicon material over the first polysilicon material and ii) epitaxially growing a second doped layer over the first doped layer, where the grown second polysilicon material and the epitaxially grown second doped layer form a basis for a strap merging the second doped layer and the second polysilicon material.

Another aspect of the present disclosure includes: providing a bulk substrate with a first doped layer thereon, depositing a first hard mask over the substrate, forming a trench through the substrate, filling the trench with a first polysilicon material, and after filling the trench with the first polysilicon material, i) growing a second polysilicon material over the first polysilicon material and ii) epitaxially growing a second doped layer over the first doped layer, where the grown second polysilicon material and the epitaxially grown second doped layer form a basis for a strap merging the second doped layer and the second polysilicon material, selecting the first doped layer to be counter-doped in relation to the second doped layer, where prior to performing the epitaxial growth, depositing a plurality of inner spacers on at least two exposed sidewalls of the trench, depositing a second hardmask or cutmask over a portion of the second doped layer and the second polysilicon material, removing an exposed portion of i) the second doped layer and ii) the second polysilicon material to form a recess over a portion of the second doped layer, removing the second hardmask, and creating a shallow-trench isolation region in the recessed portion of the second doped layer, where the remaining portion of the second polysilicon material and the second doped layer form the strap, where the deposition of the second hardmask is such that it covers a suitable area such that when the second hardmask is removed it enables formation of the strap.

Another aspect of the present disclosure includes a semiconductor structure. The semiconductor structure includes: a substrate with a first doped layer thereon, a second doped layer disposed over the first doped layer, a trench formed through the substrate, with a dielectric liner deposited along an exposed perimeter therein, a first polysilicon material filling the trench in the substrate, a second polysilicon material in contact with the first polysilicon material, where the second polysilicon material and the second doped layer form a connection over the first doped layer, and a shallow-trench isolation (STI) region in contact with the connection and forming a strap structure and separating the semiconductor structure from another device, where the second doped layer is counter-doped in relation to the first doped layer.

Another aspect of the present disclosure includes a semiconductor structure. The semiconductor structure includes: at least two Embedded Dynamic Random Access Memory (eDRAM) structures each including: a substrate with a first doped layer thereon, a second doped layer disposed over the first doped layer, a trench formed through the substrate, with a dielectric liner deposited along an exposed perimeter therein, a first polysilicon material filling the trench in the substrate, a second polysilicon material in contact with the first polysilicon material, where the second polysilicon material and the second doped layer forming a connection over the substrate, a transistor spacer layer over i) the doped layer, ii) the second polysilicon material, and iii) the shallow-trench isolation layer, a shallow-trench isolation (STI) region in contact with the connection, forming a strap in the structure and separating it from at least one neighboring device, and a vertical transistor structure over the transistor spacer layer, where the shallow-trench isolation region of one of the at least two eDRAM structures electrically isolates the vertical transistor structure of one of the at least two eDRAM structures from another vertical transistor structure of another one of the least two eDRAM structures.

BRIEF DESCRIPTION OF THE SEVERAL VIEWS OF THE DRAWINGS

FIG. 3A illustrates removal of the hardmask and trench formation in accordance with at least one embodiment of the present disclosure.

FIG. 3B illustrates a top-down view of the structure associated with FIG. 3A.

FIG. 4A illustrates an epitaxial growth process in accordance with at least one embodiment of the present disclosure.

FIG. 4B illustrates a top-down view of the structure associated with FIG. 4A.

FIG. 5A illustrates a chemical-mechanical planarization process in accordance with at least one embodiment of the present disclosure.

FIG. 5B illustrates a top-down view of the structure associated with FIG. 5A.

FIG. 6A illustrates another hardmask deposition in accordance with at least one embodiment of the present disclosure.

FIG. 6B illustrates a top-down view of the structure associated with FIG. 6A.

DETAILED DESCRIPTION

Figure 1B:
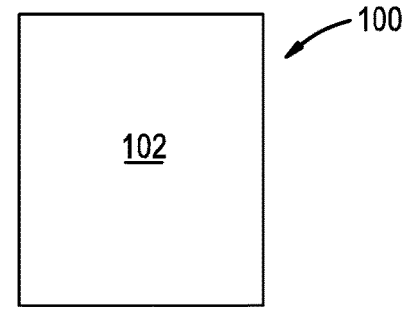
FIG. 1B illustrates a top-down view of the structure associated with FIG. 1A.

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

One aspect of the present disclosure includes forming and connecting an eDRAM infrastructure in the vertical transport field effect transistor ("VTFET") scheme. In one embodiment, this results in space savings and prevention of electrical shorts, where one or more of these benefits is provided by one or more features of the present disclosure, including by employing either one or both of i) a strap, e.g. doped polycrystalline semiconductor material, formed during the epitaxial growth of semiconductor source/drain regions, e.g. doped single crystalline material, of a vertical device and/or ii) employing an eDRAM hard mask or cutmask to facilitate the latter. One advantage of employing this scheme and establishing large space savings is increased device density. This is a general driving force for transistor development, and particularly for vertical transistor device and integration development. According to one embodiment, the general space reduction in the vertical transistor context is enhanced by connecting the bottom of a vertical device, e.g. source/drain region, with an eDRAM strap. In one embodiment, a vertical transistor device is formed laterally, but in close proximity to a eDRAM trench, where in one embodiment, this results in a slight offset between the eDRAM trench and the vertical transistor device, with the distance between the eDRAM strap and the vertical transistor being minimized.

In one embodiment, one or more features and techniques of the present disclosure provides for an eDRAM cell connecting with the vertical device by having a doped polycrystalline semiconductor material formed during epitaxial growth of source/drain regions, e.g. doped single crystalline regions, of the vertical device. One of the advantages of this feature is that formation of bottom source drain epitaxy and the strap can occur at the same process step. In one embodiment, after chemical-mechanical planarization, as opposed to conventional techniques, a dimensionally configured hardmask or cutmask is used. The cut mask is deposited in a manner that enables removal of material that is not part of the eDRAM cell or the vertical transistor device. For example, the cutmask enables removal of some of the grown material over the substrate, e.g. uncovered polycrystalline material underneath the cutmask is removed. In one embodiment, this also enables subsequent formation of a shallow-trench isolation layer or region (STI) around the deep-trench/eDRAM and the VTFET, while also allowing for a larger strap size. One or more of these features reduces shorting problems associated with lateral devices, e.g. shorts between one or more lateral eDRAM devices, while also enhancing overall device density, both of which are particularly important improvements for technology nodes less than or equal to 14 nm. For example, this scheme, per one embodiment, prevents lateral shorts between multiple devices or other adverse connectivity issues, as forming the STI region after the epitaxial growth for strap formation prevents an adverse electrical connection between one or more neighboring eDRAM structures from taking place. Furthermore, pursuant to one embodiment, the VTFET channel is only epitaxially grown and/or deposited where needed, eliminating issues associated with portions of the VTFET running over eDRAM trenches.

Figure 1A:
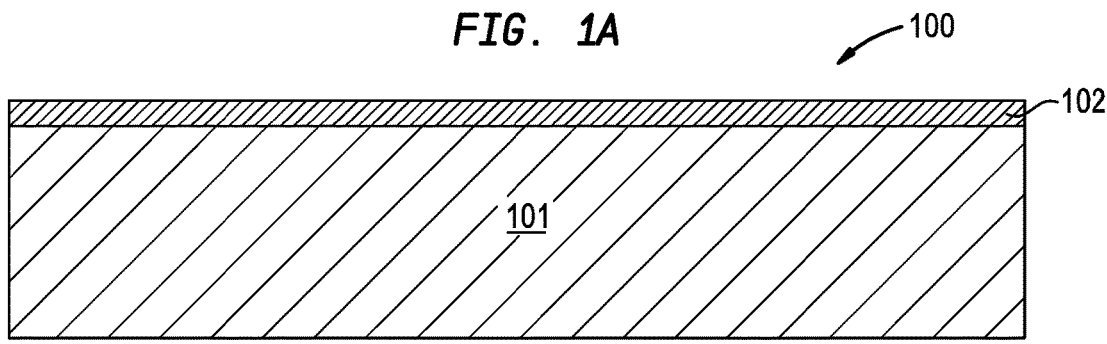
FIG. 1A illustrates a substrate suitable for use with one or more embodiments of the present disclusui e.

FIG. 1A illustrates a semiconductor structure 100 with substrate 101, which includes one or more semiconductor materials. FIG. 1B is a top-down view of 100. Non-limiting examples of suitable materials for layer 101 include Si (silicon), strained Si, Ge (germanium), SiGe (silicon germanium), Si alloys, Ge alloys, III-V materials (e.g., GaAs (gallium arsenide)), InAs (indium arsenide), InP (indium phosphide), or Gallium Indium arsenide (InGaAs)), II-VI materials (e.g., CdSe (cadmium selenide)), CdS (cadmium sulfide), CdTe (cadmium telluride), ZnSe (zinc selenide), ZnS (zinc sulfide), or ZnTe (zinc telluride)), or any combination thereof.

In one embodiment, the substrate is a Si based layer, including a Si or SiGe layer. A counter-doped layer 102 is generated on the substrate 101 and includes a different/opposite dopant than in a subsequent deposited doped source, which is described in greater detail below. The term counter-doped layer refers to a layer, e.g. layer 102, that is doped opposite to another reference layer, e.g. the subsequently deposited doped source layer. For example, when the doped source layer includes a p-type dopant, the counter-doped layer 102 includes an n-type dopant, and when the doped source layer includes an n-type dopant, the counter-doped layer 102 includes a p-type dopant. In one embodiment, the substrate 101 and associated counter-doped layer 102, as described below, is a bulk, single crystalline Si layer, the counter-doped layer 102 includes a p-type dopant, and the doped source layer includes an n-type dopant. Suitable p-type dopants include boron and gallium and suitable n-type dopants include phosphorus and arsenic. In one embodiment, the thickness of the counter-doped layer 102 may be in a range from about 5 to about 100 nm, or from about 20 to about 70 nm. In one embodiment, the dopant concentration of any of the doped layer described herein, including layer 101 can range from $5\times10^{18}$ atoms/cm$^3$ to $5\times10^{19}$ atoms/cm$^3$ for one or more of any of the doped layers described herein.

Figure 2B:
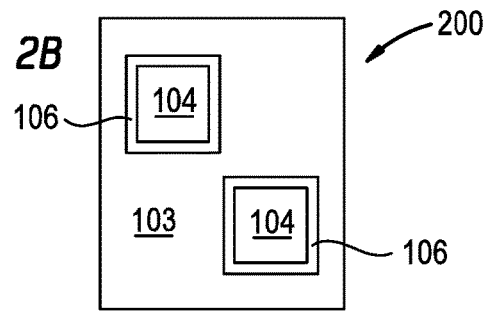
FIG. 2B illustrates a top-down view of the structure associated with FIG. 2A.
Figure 2A:
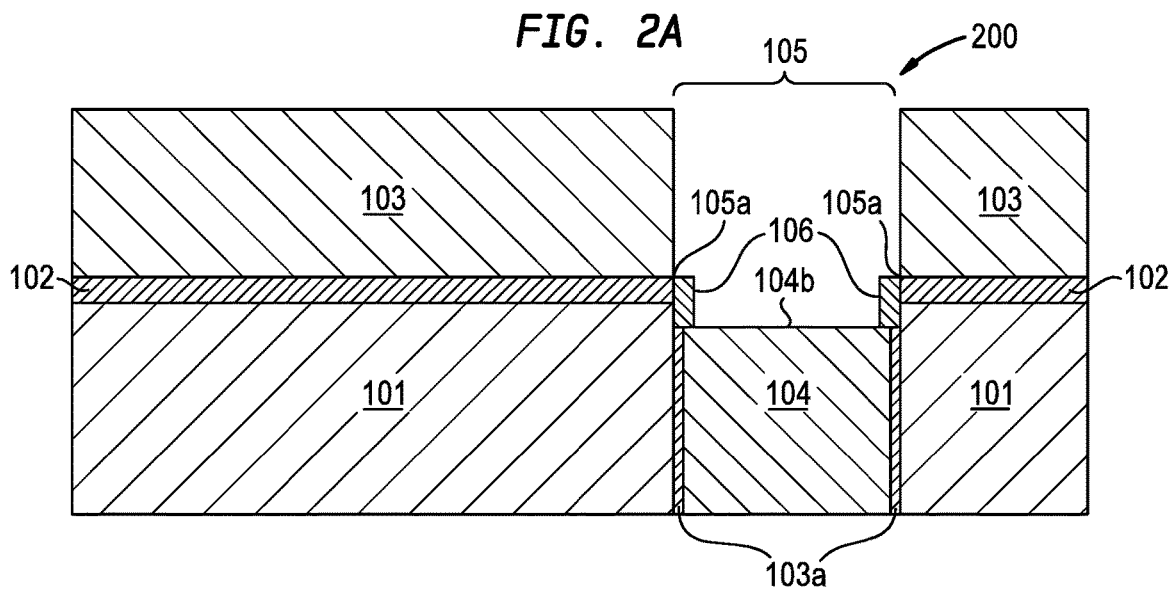
FIG. 2A illustrates a structure employing a hard mask in accordance with at least one embodiment of the present disclosure.

FIG. 2A illustrates formation of a trench 105, e.g. deep trench associated with eDRAM, and other modifications to the structure 100 in accordance with one or more embodiments of the present disclosure, resulting in the structure 200. FIG. 2B is a top-down view of 200. Pursuant to this embodiment, the trench, e.g. deep trench, is a trench associated with eDRAM development, and is developed prior to depositing a doped source layer over the counter-doped layer 102. A hardmask 103 is deposited over the counter-doped layer 102 using any suitable hardmask deposition techniques. The hardmask 103 can be a nitride, oxide, or other suitable material. After depositing the hardmask 103, the trench 105 is formed using a suitable etch technique, including reactive ion etching (RIE) to create an opening as shown in the structure 200. In one embodiment, the RIE technique is substantially anisotropic (for which many suitable processes are known). The trench 105 defines an area in which the eDRAM cell will be formed. In one embodiment, the depth of the trench may be from 1 μm to 10 μm. In one embodiment, the trench is approximately 4 μm in depth, although other dimensions are contemplated in accordance with the techniques of the present disclosure.

The trench 105 may be partially or substantially filled with a conductive polycrystalline material 104, e.g. polysilicon 104 to form the basis of a capacitor. (Polysilicon material 104 is referred to interchangeably as polysilicon 104, polysilicon material 104, polysilicon layer 104, or layer 104). In one embodiment, the polysilicon material 104 fills the trench 105 to a height where the upper surface of the polysilicon 104 is below the upper surface of the substrate 101 and the counter-doped layer 102 associated therewith.

Additional trench processing steps may be optionally completed prior to the deposition of the polysilicon material 104. For example, the trench 105 may be lined with an isotopically deposited dielectric layer 103a (node dielectric or dielectric liner). The dielectric liner 103a may include, for example, oxides, nitrides, oxynitrides and/or high-k materials, and can be formed within the openings by any suitable process such as thermal oxidation, thermal nitridation, ALD, or CVD.

In one embodiment, the dielectric liner 103a may comprise a high-k material selected from high-k materials, including $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_0N_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. The node dielectric material can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the node dielectric material can have a thickness in a range from 1 nm to 10 nm, although other thicknesses are contemplated in accordance with the teachings provided herein.

In one embodiment, the polysilicon material 104 is in-situ doped. In one embodiment, the deposited polysilicon material is doped (using any suitable implantation method) to be n-doped material.

The polysilicon 104 can be deposited by a suitable deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. In one embodiment, the polysilicon material 104 is in-situ doped, and in one embodiment the dopant employed will be opposite to the doping associated with the counter-doped layer 102. In one embodiment, the deposited polysilicon material is doped (using any suitable implantation method) such that it will be opposite the dopant concentration of the subsequently formed doped source layer, e.g. it will be an n-doped layer and the counter-doped layer 102 will be a p-doped layer.

In one embodiment, inner spacers or collars 106 may be deposited upon the trench 104 perimeter and upon the sidewall(s) 105a of trench 105 using any suitable deposition technique, e.g. for example, chemical vapor deposition (CVD) or physical vapor deposition (PVD). The spacer material may include Silicon nitride (SiN), Silicon-boron-carbonitride (SiDCN), SiliconCarbooxy-nitride (SiOCN) and Siliconcarbooxide (SiOC). An upper surface of spacers 106 may be coplanar with the upper surface of the layer 102. In one embodiment, the inner spacers 106 can be utilized where the polysilicon 104 filling the trench 105 is formed to a height where the upper surface 104b of the polysilicon 104 is below the upper surface of the counter-doped layer 102. Alternatively, the upper surface of the spacers 106 may be above the upper surface of the counter-doped layer 102. In one embodiment, the collars 106 can be any suitable silicon-oxide material, e.g. $SiO_2$, which isolates the sidewall(s) 105a from the counter-doped layer 102 and the substrate 101. Although not shown, the collars can be longer in the vertical direction, where in the one embodiment the collar(s) 106 are 50 nm-250 nm in length.

FIG. 3A illustrates removal of the hardmask 103 off of the structure of 200, resulting in structure 300. FIG. 3B illustrates a top-down view of the structure 300. The hardmask 103 may be removed by using a selective etch process or any other suitable method. In one embodiment, wet etching which has selectivity between the hardmask 103 and the underlying substrate 101 and associated counter-doped layer 102 can be used. Hydrofluoric acid (HF), buffered hydrofluoric acid (BHF) or other materials or combinations of materials may be used to remove the hardmask 103. A dry etch process such as RIE may also be used.

FIG. 4A illustrates performing a growth process to structure 300, where, per one embodiment of the present disclosure, the growth process results in a merger of the two layers at 102a over the substrate 101, at least a portion of which can form the basis of a strap as discussed below, and associated counter-doped layer 102, resulting in a structure 400. FIG. 4B illustrates a top-down view of the structure 400. In one embodiment, a growth process occurs over the trench 105 and over the layer 102, where substrate 101 and associated counter-doped layer 102 are single crystalline layers/structures, as such the growth associated therewith is epitaxial in nature. In one embodiment, initiating growth under these conditions results in grown material grown from a polycrystalline material, e.g. polysilicon, which is non-epitaxial, and which grows at a faster rate, relative to epitaxial growth from single crystalline surface of semiconductor materials. Therefore, growth of material 104' from polysilicon 104 occurs at a faster rate than the epitaxial growth of material associated with layer 107, e.g. a heavily in-situ doped source layer 107 or single crystalline layer 107, and layer 102, which results in a thicker or more polycrystalline grown material with respect to 104' relative to epitaxially grown material associated with the doped source layer 107. The growth associated with the material 104' and the epitaxial growth associated with layer 107 results in an electrical connection between the two layers, with interfaces at 102a, as the single crystalline material over the counter-doped layer 102 merges with the polycrystalline/polysilicon material 104' that is grown over the deposited polysilicon material 104 in the trench. (Polysilicon material 104' is referred to interchangeably as polysilicon 104', polysilicon material 104', polysilicon layer 104', or layer 104'). Since the substrate 101 is a bulk single crystalline material, e.g. bulk silicon, doped source layer 107 will also be single crystalline material, e.g. a single crystalline silicon layer, and similarly, as stated and implied, material 104' will be polycrystalline, e.g. polysilicon.

Per one embodiment, both doped source layer 107 and material 104 are doped with matching dopant types (using any suitable implantation method, including being in-situ doped), where doped source layer 107 is a doped silicon layer with a heavy dopant concentration e.g. a dopant concentration in a range from about $10^{19}$ to about $10^{22}$ atoms/cm$^3$. In one embodiment, layer 107 and 104 are both n-doped layers, which are opposite the dopant (p-type) of counter-doped layer 102, where in one embodiment, arsenic is used as a dopant for layer 104 and layer 107.

Accordingly, pursuant to at least one embodiment, a single crystalline layer 107 and the polycrystalline material 104' are formed simultaneously utilizing a single growth process, as defined above. The growth process will form the single crystalline layer 107 and polycrystalline material 104', resulting in the merger of the two as discussed above. The single crystalline semiconductor material 107 serves as the bottom source/drain regions of a to-be-formed VTFET device, while a portion of the polycrystalline material 104' will serve as a basis for a strap connecting the eDRAM cell to the VTFET.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The growth associated with doped source layer 107 and polysilicon material 104, which, as stated, forms interface 102a between the two layers, effectively merging and electrically connecting them, forms the basis for a strap to link or merge the doped source layer 107 to the to-be-deposited transistor structure and polysilicon material 104. As such, the connection between 104' and 107 forms the basis for establishing a connection between a layer, e.g. the channel, of a vertical transistor device that formed over one or more layers on top of the substrate 100. In one embodiment, as discussed below, the strap provides a conductive path with the polysilicon material 104, e.g. the capacitor of the eDRAM, and the subsequently deposited vertical transistor, where the polysilicon material 104, which forms the basis of an eDRAM capacitor, is connected directly to grown layer 104a and epitaxially grown layer 107 as a result of the merger that takes place by virtue of the process as laid out herein.

Examples of materials that can be used for initiating the epitaxial growth process include Si or SiGe, which can include in-situ doped Si or SiGe. The specific material depends upon the underlying seed material, and as stated, in the instance where Si forms the basis for layers 101, 102 and material 104, the grown layers 104', 107 will be silicon. Examples of various epitaxial growth process apparatuses that are suitable for use in forming epitaxial semiconductor material of the present application include, e.g., reduced pressure chemical vapor deposition (RPCVD), rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the epitaxial semiconductor material typically ranges from 450° C. to 900° C.

Given the nature of the process as described herein, layer 104' will likely overshoot over doped source layer 107, as shown in FIG. 4A. Accordingly, as illustrated in FIG. 5A and per one embodiment, any suitable chemical-mechanical planarization (CMP) process can be applied to layer 104' to remove any excess epitaxially grown material that extends on top of the structure 400, where the CMP process results in structure 500 and a planar layer 104a, which is layer 104' after it has undergone CMP. FIG. 5B illustrates a top-down view of the structure 500. (Polysilicon material 104a is referred to interchangeably as polysilicon 104a, polysilicon material 104a, polysilicon layer 104a, or layer 104a).

Figure 7B:
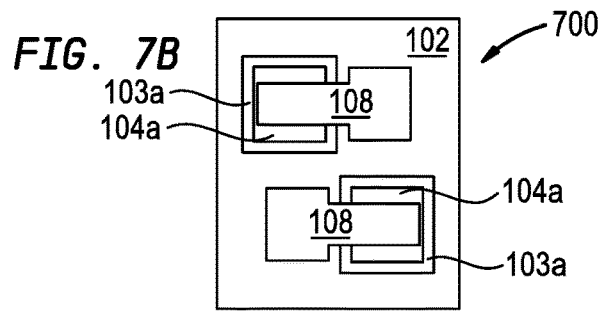
FIG. 7B illustrates a top-down view of the structure associated with FIG. 7A.
Figure 7A:
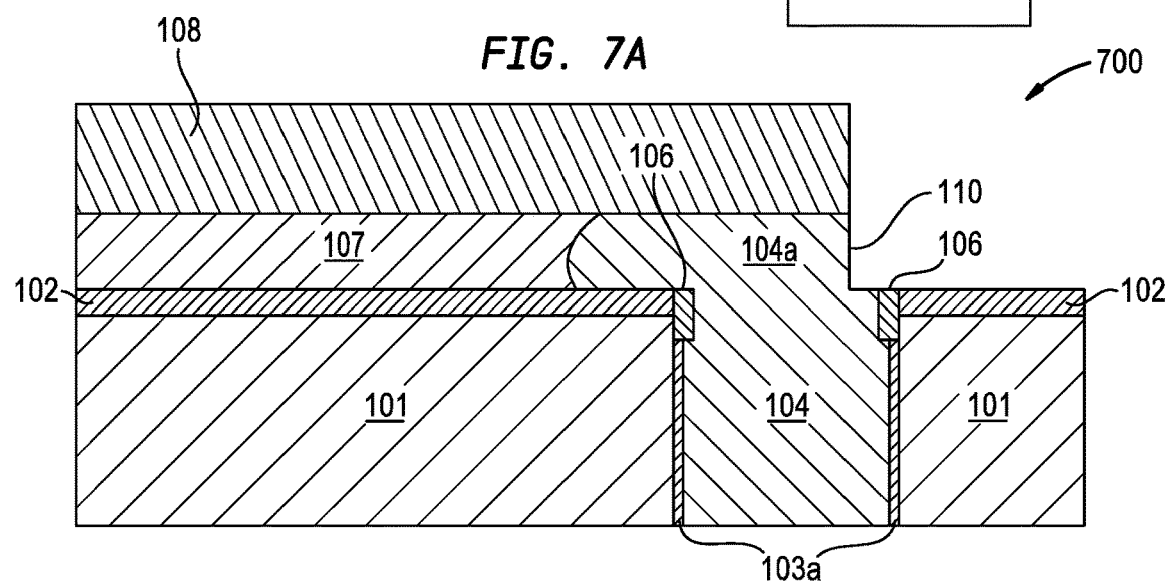
FIG. 7A illustrates an etching process in accordance with at least one embodiment of the present disclosure.

FIG. 6A and FIG. 7A illustrate structures 600 and 700, respectively. FIG. 6B and FIG. 7B illustrate a top-down view of structures 600 and 700, respectively. In FIG. 6A, per one embodiment, and contrary to conventional techniques, a second hardmask is deposited using any suitable deposition technique, e.g. a second hardmask or cutmask 108 is deposited over a portion of layer 107 and 104a such that a strap basis layer 102a' is formed, e.g. it will become the strap after completion of STI formation, resulting in structure 600. In one embodiment, the hardmask 108 protects underlying portions of covered material while leaving portions of unwanted material, e.g. polycrystalline material, exposed, where the unwanted material is subsequently removed. The cutmask 108 can be formed by deposition and etching. In one embodiment, the cut mask 108 enables removal of all un-needed semiconductor material outside the regions of the exemplary structure(s) described herein, which include the to-be-formed VFT device and the eDRAM (including a to-be-formed STI region). As such, in one embodiment, the cutmask 108 is an eDRAM cutmask 108 that enables the enhancement of device density and disables eDRAM shorts. In one embodiment, the cutmask 108 can include a dielectric material that is compositionally different from any of the spacer materials. In one embodiment, when the polycrystalline material is composed of silicon, potassium hydroxide may be used to remove the polycrystalline material not protected by the cut mask.

In one embodiment, the hardmask 108 is selected to cover half or more of the surface of material 104a filling the trench along the lateral direction, and in turn enables removal of a portion of unwanted and uncovered polycrystalline material underlying the hardmask. In one embodiment, half or more of the trench length in the lateral direction is covered by the mask, which in turn, and as discussed below, facilitates the strap and vertical transistor structure according to at least one embodiment as described below, e.g. permitting a longer strap length but with mitigated distance with respect to the vertical transistor device. In one embodiment, a shallow trench isolation structure (STI), as discussed below, will be deposited over an opening after removal of the hardmask 108, and it will have a slight offset into the trench, e.g. it will cover no more than half of the area of the trench.

As above, the second hardmask 108 can be a nitride, oxide, or other suitable material. After depositing the second hardmask 108, as implied, the exposed portion of the strap basis layer 102a' is removed using a suitable etch process, e.g. reactive ion etching (RIE) to create an opening 110, resulting in structure 700. In one embodiment, the RIE technique can be substantially anisotropic. In one embodiment, the opening leaves the top portion of 104, a lateral portion of 104a, and a top portion of 102 exposed. In effect, per one embodiment, opening 110 can be considered a shallow-trench isolation (STI) trench 110, as 110 will be filled, as described below, with a suitable STI material.

Accordingly, as provided by at least one embodiment above, polycrystalline material not protected by the cultmask 108 may be removed, e.g. an eDRAM cutmask or second hardmask 108 is formed, and thereafter, the doped polycrystalline semiconductor material not protected by the cutmask is removed utilizing an etching process that is selective in removing the material underlying the cutmask 108, while a portion of the doped polycrystalline semiconductor material remains beneath the eDRAM mask and is in contact with the doped single crystalline material. This in turn allows for a denser completed eDRAM structure after removal of the second hardmask 108 (as described below).

Figure 8B:
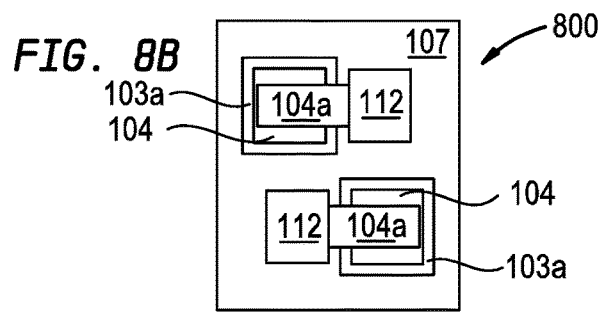
FIG. 8B illustrates a top-down view of the structure associated with FIG. 8A.
Figure 8A:
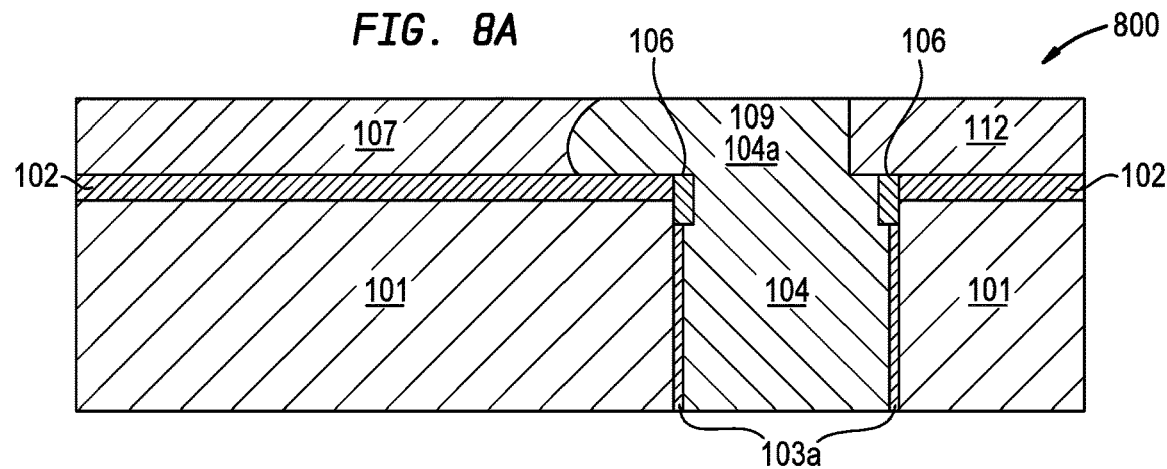
FIG. 8A illustrates formation of a shallow-trench isolation region/layer in accordance with at least one embodiment of the present disclosure.

FIG. 8A illustrates structure 800, which includes removal of the hardmask 108 and the filling of the STI trenches 110 to form STI region 112 and final formation of a strap 109, resulting in structure 800. FIG. 8B illustrates a top-down view of structure 800. The hardmask 108 can be removed using any suitable etch process, including wet etching which has selectivity between the hard mask and the underlying layers 107 and 104a. Hydrofluoric acid (HF), buffered hydrofluoric acid (BHF) or other materials or combinations of materials may be used to remove the hard mask 115.

The STI region 112 can be formed using any suitable process, including depositing an insulator or dielectric material, e.g. an oxide or nitride, in the opening 110 using suitable deposition techniques, bringing the STI region 112 in direct contact with the counter-doped layer 102. Once the STI region 112 is formed, the connection between 104a and 104 into 107 constitutes the strap 109 that allows the ultimate transistor structure to electrically connect to the eDRAM capacitor. As shown, and according to one embodiment, the STI region 112 forms an interface with layer 104 and layer 104a such that it can isolate structure 800 (and any vertical devices constructed over structure 800), while still permitting a direct electrical communication with any device built over structure 800 and layer 104, e.g. eDRAM capacitor. That is to say, the opening 110 and subsequent deposition of STI region 112 are such that the material filling and over the trench 104 and 104a is not isolated from the rest of the structure 800, e.g. the STI region 112 extends only partially over layer 104. Although not expressly shown, any excess deposited STI material can be removed by a suitable CMP process.

Figure 8C:
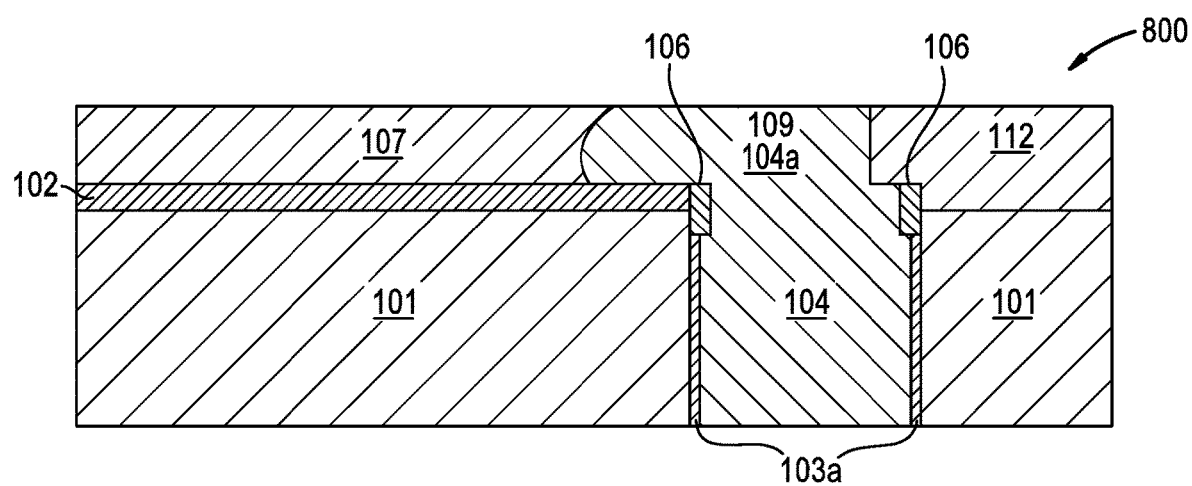
FIG. 8C illustrates a semiconductor structure after at least on etch technique takes places in accordance with at least one embodiment of the present disclosure.

In one embodiment, as shown in FIG. 8C, structure 800' is illustrated. In this embodiment, prior to removing the hardmask 108, in addition to removing the exposed portion of the doped souice layer 107 and layer 104a, one or more success and/or iterative etch steps, e.g. RIE, is carried out with respect to the counter-doped layer 102. In this embodiment, the subsequently deposited STI layer 112 is in direct contact with the substrate 101 and, as such, enables a superior electrical connection with respect to the strap 109 and the device capacitor and to be developed transistor structure.

In one embodiment, STI region 112 surrounds the filled trench 105 (filled with polysilicon 104 and dielectric 103a). As mentioned above, per one embodiment, the hardmask 108 is selected, deposited, and removed not only in a manner that permits the STI scheme, but also enables a strap size and placement that allows for a denser packing of vertical transistor devices on a single substrate. The STI region 112 isolates one device from another (lateral) device and addresses shorting issues associated therewith (as explained above), which can be particularly acute problems at nodes less than or equal to 14 nm. FIG. 9B discussed below provides a high level overview of these benefits by illustrating the enhanced density and insulation this scheme affords.

Figure 9A:
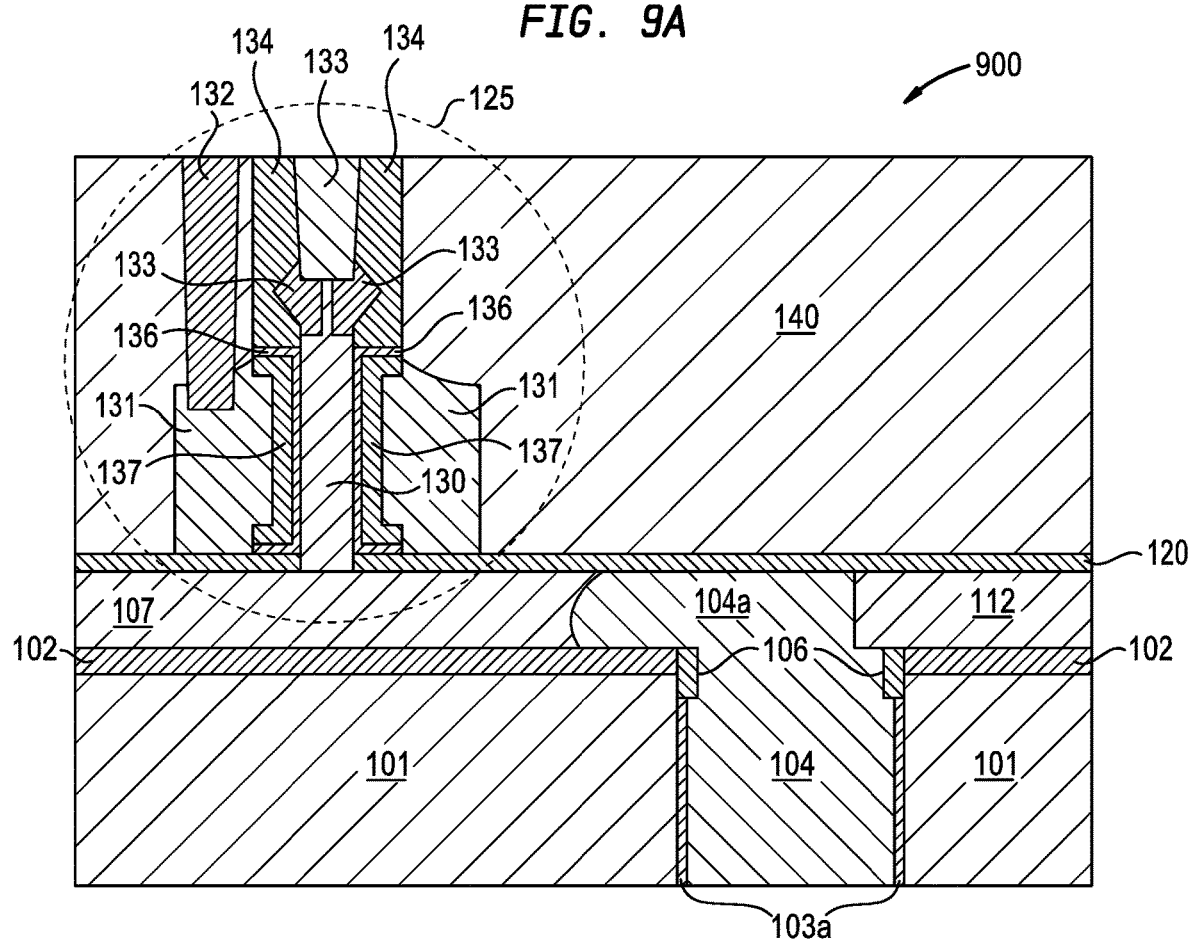
FIG. 9A illustrates formation of a vertical transistor structure in accordance with at least one embodiment of the present disclosure.
Figure 9B:
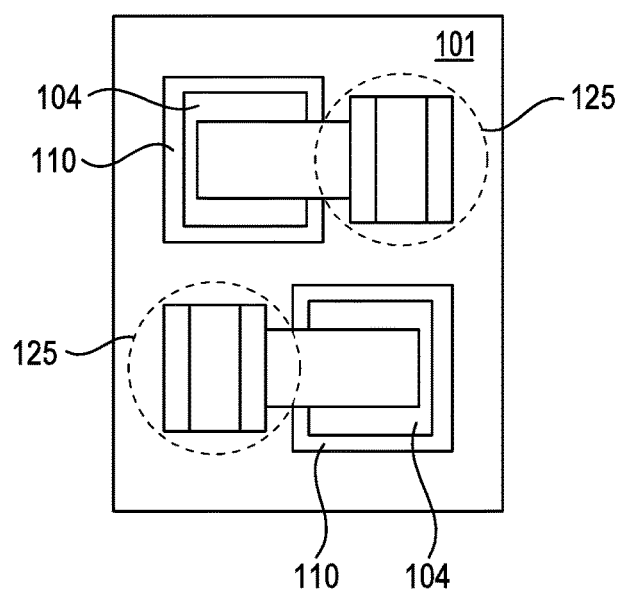
FIG. 9B illustrates a top-down view of the structure associated with FIG. 9A.

FIG. 9A illustrates structure 900, which includes a fully formed vertical transistor 125 over the device 800. U.S. Pat. No. 9,525,064 entitled "Channel-Last Replacement Metal-Gate Vertical Field Effect Transistor," and U.S. Pat. No. 9,806,173 also entitled "Channel-Last Replacement Metal-Gate Vertical Field Effect Transistor," the entirety of both which is incorporated herein by reference, discloses a vertical transistor and method of making the same over a suitable surface. FIG. 9B is a top-down view of structure 900. In the present disclosure, in order to establish connection with device 800, including layer 104, a bottom spacer 120, referred to herein for convenience as a transistor spacer layer, is deposited over structure 800, e.g. over layer 107, 104a, and 112. As above, the transistor spacer 120 can be deposited according to any suitable deposition process, for example, chemical vapor deposition (CVD) or physical vapor deposition (PVD). The transistor spacer 120 can include an insulating material, e.g. a nitride, for example, Silicon nitride (SiN), Silicon-boroncarbonitride (SiBCN), Silicon-carbooxy-nitride (SiOCN) and Siliconcarbooxide (SiOC). In one embodiment, the spacer 120 can have a thickness of about 3 nm to about 15 nm.

According uo one embodiment, the spacer 120 is etched using a process that is selective to (will not substantially remove) material associated with doped source layer 107, e.g. the heavily doped source material, e.g. for example, a reactive ion etch (RIE), in order to expose a portion of the underlying source contact layer, e.g. doped source layer 107, which in turn can enable the channel 130 of the vertical transistor 125 to electrically connect directly through the structure, including to polysilicon material 104, e.g. eDRAM capacitor. Heavily doped concentration as used herein can mean having a dopant concentration of $1 \times 10^{19}$ $cm^{-3}$ to $1 \times 10^{21}$ $cm^{-3}$, or as is otherwise understood and/or suitable in the art. Suitable vertical transistor fabrication process can be modified to enable this connection, e.g. by developing the structure 800 as described herein, depositing spacer 120 there-over, and etching spacer 120, selectively, to enable growth or deposition of the channel 130 in a manner that connects through the device, e.g. electrically connects to layer 104 by directly physically contacting doped source layer 107. In one embodiment, complete fabrication of the vertical transistor can result in the transistor 125 having a channel 130 connected to a heavily doped source layer 107, one or more thin dielectric layers 136, e.g. thin oxide, in contact with the channel 130, one or more work function metals 137 in contact with the one or more thin dielectric layers 136, which in turn are connected to one or more metal gate materials 131. The structure can further include a gate contact 132 in contact with the metal gate material 131, a dielectric capping layer 133 in contact with the channel 130 and material 135 associated with a drain region of the device 125, and one or more device spacers 134 in contact with the one or more dielectric layer 136. Per one embodiment, after all device steps are carried out to form the transistor device 125, and inter-layer dielectric material (ILD) 140 is formed over the structure 900, where material 140 can include any suitable ILD material, such as, a low-k dielectric material (with k<4.0), including but not limited to, silicon oxide, spin-on-glass, a flowable oxide, a high density plasma oxide, borophosphosilicate glass (BPSG), or any combination thereof. The ILD layer can be deposited by a deposition process, including, but not limited to CVD or PCVD. Other embodiments and configurations are contemplated, provided that a direct path for the channel 130 of a deposited vertical transistor device 125 and the rest of the structure, e.g. an electrical connection to an eDRAM capacitor region, can be established. Since the contents of this disclosure, pursuant to at least one embodiment described herein, provide for a direct path for deposition, e.g. epitaxial growth, of the channel 130, an advantage is offered over other schemes where an additional cut step, e.g. fin cut, may be omitted and electrical connection can be created directly when the transistor 125 is formed over the spacer 120.

Although not expressly stated above, the semiconductor material that provides for the single crystalline layer 107 and the polycrystalline material 104 may comprise a same semiconductor material as that which provides the channel 130. In other embodiments of the present application, the semiconductor material that provides for the single crystalline layer 107 and the polycrystalline material 104 may comprise a different semiconductor material than that which provides the channel 130. For example, the of the single crystalline layer 107 and the polycrystalline material 104 can include a silicon germanium alloy, while the channel 130 can be composed of silicon.

In one embodiment, as a result of a cutmask 108 placement as described above, the VTFET device is in close proximity to an associated EDRAM trench in relation to an underlying substrate, e.g. at least one-third offset in the lateral direction along the underlying substrate such that the distance between the VFFET and the trench is less than or equal to one third the substrate length in the lateral direction. In one embodiment, the hard mask 108 facilitates a strap 109 length such that the strap is as short as possible, while permitting a slight offset between the VTFET and the EDRAM trench and enabling the distance between the VTFET to be as described, e.g. one third the substrate length in the lateral direction.

As such, at least one embodiment of the present disclosure offers an embedded dynamic access memory (eDRAM) cell with a trench present in a bulk substrate and laterally adjacent to a vertical transistor device, where a strap composed of a doped polycrystalline semiconductor material connects a polycrystalline semiconductor material of the eDRAM structure to the source/drain region of the vertical transistor device.

FIG. 9B illustrates a high-level, top-down overview, of a structure 900 demonstrating one of the benefits of at least one embodiment of the present disclosure. One or more vertical transistors located on a substrate 101 are electrically isolated from one another by each respective STI region 112. The trenches filled with polysilicon 104 are permitted to form unencumbered connections because each vertical transistor 125 is electrically isolated from the other. Moreover, because the STI 112 interface (as discussed above) permits for a larger strap size, a denser packing of the devices 125 on the substrate 101 is possible.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
providing a substrate with a first doped layer thereon;
forming a trench through the substrate and the first doped layer;
filling the trench with a first polysilicon material;
after filling the trench with the first polysilicon material,
 i) growing a second polysilicon material over the first polysilicon material and ii) epitaxially growing a second doped layer over the first doped layer, wherein the grown second polysilicon material and the epitaxially grown second doped layer form a basis for a strap merging the second doped layer and the second polysilicon material; and
performing a planarization process on an excess portion of the grown second polysilicon material that grows over the second doped layer.

2. The method according to claim 1 further comprising:
prior to filling the trench with the first polysilicon material, depositing a first hardmask over the substrate;
prior to filling the trench with the first polysilicon material, depositing a dielectric liner along an exposed perimeter of the trench; and
after filling the trench with the first polysilicon material, removing the first deposited hardmask.

3. The method according to claim 2, further comprising selecting the first doped layer to be counter-doped in relation to the second doped layer, wherein i) the second doped layer, ii) the first polysilicon material, iii) the second polysilicon material, and iv) the substrate are doped with a same dopant-type and wherein the substrate comprises a bulk silicon layer.

4. The method according to claim 3, wherein i) the second doped layer, ii) the first polysilicon material, iii) the second polysilicon material, and iv) the substrate are n-doped.

5. The method according to claim 3 further comprising:
prior to performing the epitaxial growth, depositing a plurality of inner spacers on at least two exposed sidewalls of the trench.

6. The method according to claim 2 further comprising:
depositing a second hardmask over a portion of the second doped layer and the second polysilicon material.

7. The method according to claim 6 further comprising:
removing an exposed portion, in relation to the second hardmask, of i) the second doped layer and ii) the second polysilicon material to form a recess of a portion of the second doped layer.

8. The method according to claim 7 further comprising:
removing the second hardmask; and
creating a shallow-trench isolation region in the recessed portion of the second doped layer, wherein the remaining portion of the second polysilicon material and the second doped layer form the strap, wherein the deposition of the second hardmask is such that it covers a suitable area such that when the second hardmask is removed the second hardmask enables a formation of the strap.

9. The method according to claim 8 further comprising:
forming a transistor spacer layer over the second doped layer, the second polysilicon material, and the shallow-trench isolation region.

10. The method according to claim 9, wherein the shallow-trench isolation region partially extends over the first polysilicon material.

11. The method according to claim 9 further comprising:
forming a vertical transport field effect transistor structure over the transistor spacer layer.

* * * * *